United States Patent
Pal et al.

(10) Patent No.: US 7,534,689 B2
(45) Date of Patent: May 19, 2009

(54) STRESS ENHANCED MOS TRANSISTOR AND METHODS FOR ITS FABRICATION

(75) Inventors: Rohit Pal, Fishkill, NY (US); Igor Peidous, Fishkill, NY (US); David Brown, Pleasant Valley, NY (US)

(73) Assignee: Advanced Micro Devices, Inc., Austin, TX (US)

( * ) Notice: Subject to any disclaimer, the term of this patent is extended or adjusted under 35 U.S.C. 154(b) by 185 days.

(21) Appl. No.: 11/562,209

(22) Filed: Nov. 21, 2006

(65) Prior Publication Data

US 2008/0119031 A1 May 22, 2008

(51) Int. Cl.
H01L 21/20 (2006.01)

(52) U.S. Cl. .................. 438/300; 438/301; 438/303; 438/442; 438/482; 257/E21.202; 257/E21.403; 257/E21.431; 257/E21.437; 257/E21.438; 257/E29.056; 257/E29.063; 257/E29.315

(58) Field of Classification Search ............. 438/242, 438/245, 246, 270, 150, 198, 300, 301, 302, 438/442, 482; 257/E21.202, 403, 431, 437, 257/438, E29.021, 56, 121, 315
See application file for complete search history.

(56) References Cited

U.S. PATENT DOCUMENTS

| | | | | |
|---|---|---|---|---|
| 5,181,089 A * | 1/1993 | Matsuo et al. | ............. | 257/299 |
| 5,970,352 A * | 10/1999 | Shiozawa et al. | ........... | 438/300 |
| 6,051,509 A * | 4/2000 | Tsuchiaki | ................. | 438/758 |
| 6,274,894 B1 | 8/2001 | Wieczorek et al. | | |
| 6,426,532 B1 * | 7/2002 | Iwata et al. | ................. | 257/374 |
| 6,482,714 B1 * | 11/2002 | Hieda et al. | ................. | 438/416 |
| 6,483,158 B1 * | 11/2002 | Lee | ............... | 257/408 |
| 6,852,600 B1 * | 2/2005 | Wang et al. | ................. | 438/301 |
| 2005/0133723 A1 * | 6/2005 | Lee et al. | ................. | 250/338.4 |
| 2005/0191813 A1 * | 9/2005 | Seo et al. | ................. | 438/301 |
| 2006/0166492 A1 | 7/2006 | Orlowski et al. | | |
| 2006/0214236 A1 | 9/2006 | Chien | | |
| 2006/0228842 A1 | 10/2006 | Zhang et al. | | |
| 2007/0167027 A1 * | 7/2007 | Yu et al. | ................. | 438/758 |

FOREIGN PATENT DOCUMENTS

WO 2006083546 A2 8/2006

OTHER PUBLICATIONS

International Search Report for PCT/US2007/024034, mailed May 20, 2008.

* cited by examiner

*Primary Examiner*—Michael S Lebentritt
(74) *Attorney, Agent, or Firm*—Ingrassia Fisher & Lorenz, P.C.

(57) ABSTRACT

A stress enhanced MOS transistor and methods for its fabrication are provided. In one embodiment the method comprises forming a gate electrode overlying and defining a channel region in a monocrystalline semiconductor substrate. A trench having a side surface facing the channel region is etched into the monocrystalline semiconductor substrate adjacent the channel region. The trench is filled with a second monocrystalline semiconductor material having a first concentration of a substitutional atom and with a third monocrystalline semiconductor material having a second concentration of the substitutional atom. The second monocrystalline semiconductor material is epitaxially grown to have a wall thickness along the side surface sufficient to exert a greater stress on the channel region than the stress that would be exerted by a monocrystalline semiconductor material having the second concentration if the trench was filled by the third monocrystalline material alone.

20 Claims, 4 Drawing Sheets

STRESS ENHANCED MOS TRANSISTOR AND METHODS FOR ITS FABRICATION

TECHNICAL FIELD

The present invention generally relates to MOS transistors and to methods for their fabrication, and more particularly relates to stress enhanced MOS transistors and to methods for fabricating such transistors with embedded material adjacent the transistor channel.

BACKGROUND

The majority of present day integrated circuits (ICs) are implemented by using a plurality of interconnected field effect transistors (FETs), also called metal oxide semiconductor field effect transistors (MOSFETs), or simply MOS transistors. An MOS transistor includes a gate electrode as a control electrode and spaced apart source and drain electrodes between which a current can flow. A control voltage applied to the gate electrode controls the flow of current through a channel between the source and drain electrodes.

The complexity of ICs and the number of devices incorporated in ICs are continually increasing. As the number of devices in an IC increases, the size of individual devices decreases. Device size in an IC is usually noted by the minimum feature size, that is the minimum line width or the minimum spacing that is allowed by the circuit design rules. As the semiconductor industry moves to a minimum feature size of 45 nanometers (nm) and even smaller, the performance of individual devices degrades as the result of scaling. As new generations of integrated circuits and the transistors that are used to implement those integrated circuits are designed, technologists must rely heavily on non-conventional elements to boost device performance.

The performance of an MOS transistor, as measured by its current carrying capability, is proportional to the mobility of the majority carrier in the transistor channel. It is know that applying a longitudinal stress to the channel of an MOS transistor can increase the mobility; a compressive longitudinal stress enhances the mobility of majority carrier holes and a tensile longitudinal stress enhances the mobility of majority carrier electrons. It is known, for example, to create a longitudinal compressive stress to enhance the mobility of holes in P-channel MOS (PMOS) transistors by embedding silicon germanium (eSiGe) adjacent the transistor channel. To fabricate such a device a trench or recess is etched into the silicon substrate in the source and drain areas of the transistor and the trench is refilled by using selective epitaxial growth of the SiGe. Simply increasing the germanium content of the eSiGe to increase the stress, however, is not entirely successful as increased germanium content results in increased SiGe loss from the surface of the embedded region, agglomeration of the metal silicide formed on the embedded region to reduce contact resistance to the source and drain areas, and increased stress relaxation of the embedded material as the transistor undergoes the more conventional steps encountered in fabricating the IC.

Accordingly, it is desirable to optimize methods for fabricating stress enhanced MOS transistors. In addition, it is desirable to provide an optimized stress enhanced MOS transistor that avoids the problems attendant with conventional transistor fabrication. Furthermore, other desirable features and characteristics of the present invention will become apparent from the subsequent detailed description and the appended claims, taken in conjunction with the accompanying drawings and the foregoing technical field and background.

BRIEF SUMMARY

A stress enhanced MOS transistor having enhanced majority carrier mobility is provided. The stress enhanced MOS transistor comprises a semiconductor substrate having a surface and a channel region at the surface. A first region of SiGe having a first germanium concentration is embedded in the semiconductor substrate. The first region has a bottom portion and a side portion adjacent the channel region. A second region of SiGe having a second germanium concentration less than the first germanium concentration is embedded in the first region so that the side portion has a greater thickness than the bottom portion.

A method is provided for fabricating a stress enhanced MOS transistor. In accordance with one embodiment of the invention, the method comprises forming a gate electrode overlying and defining a channel region in a monocrystalline semiconductor substrate. A trench having a side surface facing the channel region is etched into the monocrystalline semiconductor substrate adjacent the channel region. The trench is filled with a second monocrystalline semiconductor material having a first concentration of a substitutional atom and with a third monocrystalline semiconductor material having a second concentration of the substitutional atom. The second monocrystalline semiconductor material is epitaxially grown to have a wall thickness along the side surface sufficient to exert a greater stress on the channel region than the stress that would be exerted by a monocrystalline semiconductor material having the second concentration if the trench was filled by the third monocrystalline material alone.

BRIEF DESCRIPTION OF THE DRAWINGS

The present invention will hereinafter be described in conjunction with the following drawing figures, wherein like numerals denote like elements, and wherein.

DETAILED DESCRIPTION

Figure 1:
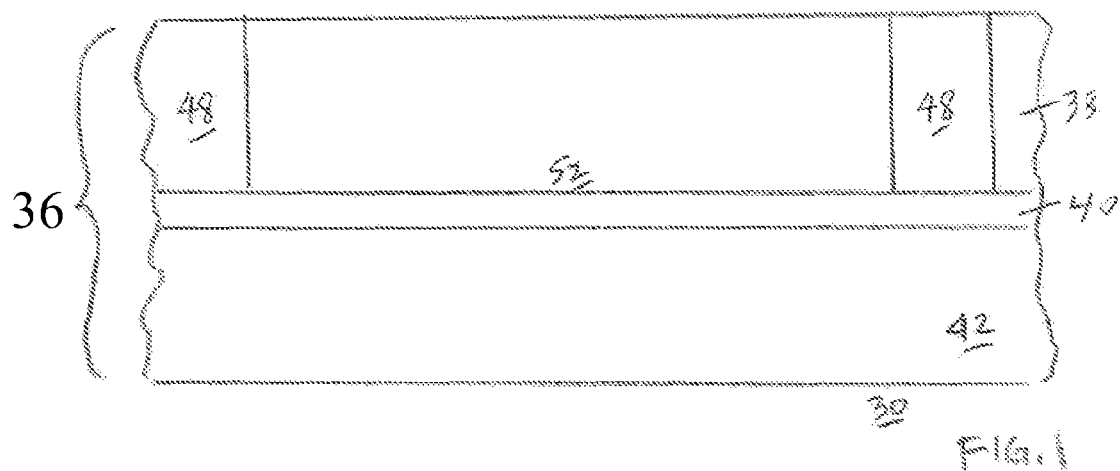
FIGS. 1-6 illustrate, in cross section, a stressed MOS transistor and method steps for its fabrication in accordance with various embodiments of the invention.

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Monocrystalline silicon, the most common semiconductor material used in the semiconductor industry for the fabrication of semiconductor devices and integrated circuits is characterized by a lattice constant, a dimension of the silicon crystal. By substituting atoms other than silicon in a crystal lattice, the size of the resulting crystal and the lattice constant can be changed. If a larger substitutional atom such as a germanium atom is added to the silicon lattice, the lattice constant increases and the increase in lattice constant is proportional to the concentration of the substitutional atom. Similarly, if a smaller substitutional atom such as a carbon atom is added to the silicon lattice, the lattice constant decreases. Locally adding a large substitutional atom to a host silicon lattice creates a compressive stress on the host lattice and adding a small substitutional atom to a host silicon lattice creates a tensile stress on the host lattice.

It is known that increasing the germanium content of embedded SiGe increases the stress that can be applied to the channel of a PMOS transistor and thereby increased the mobility of majority carrier holes in the transistor. It is also known that having a low concentration of germanium at the surface of the embedded SiGe material avoids some of the problems that are incurred by a high germanium concentration at the surface. Attempts have been made to achieve both the high germanium concentration in the bulk of the eSiGe and the low surface concentration of germanium by the following process. Trenches are etched into the source and drain areas of the transistor at the ends of the channel. Those trenches are then filled by a process of selective epitaxial growth of silicon germanium. Initially the concentration of germanium in the reactant flow is high to cause the deposition of a high germanium concentration SiGe. Midway through the epitaxial growth cycle the concentration of germanium in the reactant flow is reduced and the reduced concentration flow is maintained until the trench is filled. The result is a high germanium concentration SiGe under layer and a low germanium concentration SiGe layer at the surface. Although the device produced by such a process avoided the problems that would be encountered by a high germanium concentration at the surface of the SiGe, the mobility gain was no greater than would be expected with uniformly low germanium concentration embedded SiGe filling the trench.

In the epitaxial growth process the growing material layer substantially mimics the surface upon which it is growing. It is observed that unfortunately the selective epitaxial growth of the high germanium concentration SiGe preferentially grows from the bottom of the trench and hence the growth rate of the SiGe film on the sidewalls of the trench is low resulting in only a thin layer of high germanium concentration SiGe on the sidewalls. That is, the epitaxial growth preferentially nucleates on the crystalline structure found at the bottom of the trench rather than on the sidewall crystalline structure. The thickness of the SiGe film that covers the sidewall facing the transistor channel is the most important in applying stress to the channel, and the thickness realized by the conventional process is insufficient to achieve the desired channel stress and desired mobility gain. In accordance with the various embodiments of the invention an MOS transistor and methods for fabricating such a device are provided that achieve sufficient thickness of high germanium concentration SiGe in the region adjacent the channel to optimize the channel stress and mobility gain.

FIGS. 1-6 illustrate, in cross section, a stressed MOS device 30 and method steps for fabricating such an MOS device in accordance with various embodiments of the invention. In this illustrative embodiment stressed MOS device 30 is illustrated by a single P-channel MOS (PMOS) transistor. An integrated circuit formed from stressed MOS devices such as device 30 can include a large number of such transistors, and may also include unstressed PMOS transistors and stressed and unstressed N-channel MOS (NMOS) transistors as well.

Various steps in the manufacture of MOS transistors are well known and so, in the interest of brevity, many conventional steps will only be mentioned briefly herein or will be omitted entirely without providing the well known process details. Although the term "MOS device" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over a semiconductor substrate.

As illustrated in FIG. 1, the manufacture of a stressed MOS transistor 30 in accordance with an embodiment of the invention begins with providing a semiconductor substrate 36 in and on which such transistors are fabricated. The initial steps in the fabrication of MOS transistor 30 are conventional and will not be described in detail. The semiconductor substrate is preferably a silicon substrate having a (100) surface crystal orientation wherein the term "silicon substrate" and "silicon layer" are used herein to encompass the relatively pure monocrystalline silicon materials typically used in the semiconductor industry as well as silicon admixed with other elements such as germanium, carbon, and the like. Semiconductor substrate 36 will hereinafter be referred to for convenience but without limitation as a silicon substrate although those of skill in the semiconductor art will appreciate that other semiconductor materials could be used. Silicon substrate 36 may be a bulk silicon wafer (not illustrated), but preferably is a thin monocrystalline layer of silicon 38 on an insulating layer 40 (commonly know as silicon-on-insulator or SOI) that, in turn, is supported by a carrier wafer 42. Thin silicon layer 38 typically has a thickness of less than about 200 nanometers (nm) depending on the circuit function being implemented, and in certain applications preferably has a thickness less than about 90 nm. The thin silicon layer preferably has a resistivity of at least about 5-40 Ohm centimeter. The silicon can be impurity doped either N-type or P-type, but is preferably doped P-type. Dielectric insulating layer 40, typically silicon dioxide, preferably has a thickness of about 50-200 nm.

Isolation regions 48 are formed that extend through monocrystalline silicon layer 38 to dielectric insulating layer 40. The isolation regions are preferably formed by well known shallow trench isolation (STI) techniques in which trenches are etched into monocrystalline silicon layer 38, the trenches are filled with a dielectric material such as deposited silicon dioxide, and the excess silicon dioxide is removed by chemical mechanical planarization (CMP). STI regions 48 provide electrical isolation, as needed, between various devices of the circuit that are to be formed in monocrystalline silicon layer 38. Either before or preferably after fabrication of the STI regions, selected portions of silicon layer 38 can be impurity doped, for example by ion implantation. For example, an N-type well 52 can be impurity doped N-type for the fabrication of PMOS transistor 30.

Figure 2:
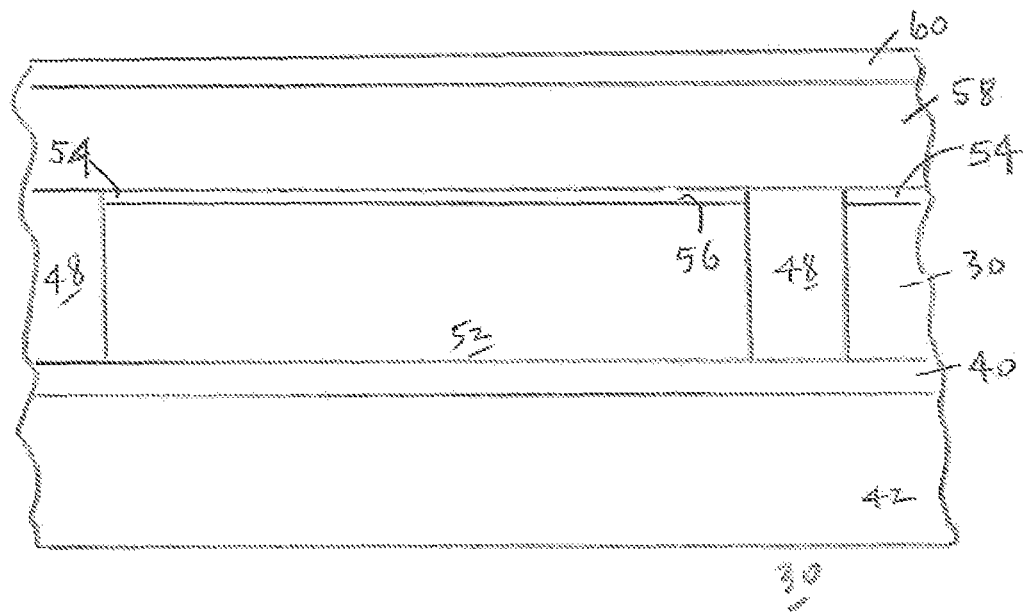

A layer of gate insulator 54 is formed on surface 56 of silicon layer 38 as illustrated in FIG. 2. The gate insulator may be thermally grown silicon dioxide formed by heating the silicon substrate in an oxidizing ambient, or may be a deposited insulator such as a silicon oxide, silicon nitride, a high dielectric constant insulator such as $Hf_xSi_yO_z$, or the like. Deposited insulators can be deposited in known manner, for example, by chemical vapor deposition (CVD), low pressure chemical vapor deposition (LPCVD), semi-atmospheric chemical vapor deposition (SACVD), or plasma enhanced chemical vapor deposition (PECVD). Gate insulator 54 is here illustrated as a thermally grown silicon dioxide layer that grows only on surface 56 of silicon layer 38. The gate insulator material is typically 1-10 nm in thickness and preferably to a thickness of about 1-2 nm. In accordance with one embodiment of the invention a layer of gate electrode forming material 58, preferably polycrystalline silicon, is deposited onto the layer of gate insulator. Other electrically conductive gate electrode forming materials such as metals and metal silicides may also be deposited providing the material by itself or with appropriate impurity doping can set the necessary threshold voltage of the transistor. The gate electrode forming material will hereinafter be referred to as polycrystalline silicon although those of skill in the art will recognize that other materials can also be employed. If the gate electrode material is polycrystalline silicon, that material is typically deposited to a thickness of about 50-200 nm and preferably to a thickness of about 100 nm by LPCVD by the hydrogen reduction of silane. The layer of polycrystalline silicon is preferably deposited as undoped polycrystalline silicon and is subsequently impurity doped by ion implantation. A layer of hard mask material 60 such as a layer of silicon nitride is deposited over the polycrystalline silicon gate electrode forming material. The layer of masking material, if silicon nitride, can be deposited, for example, by PECVD to a thickness of about 30-50 nm from the reaction of dichlorosilane and ammonia. Those of skill in the art will understand that other dielectric materials other than silicon nitride can be deposited as the hard mask material.

Figure 3:
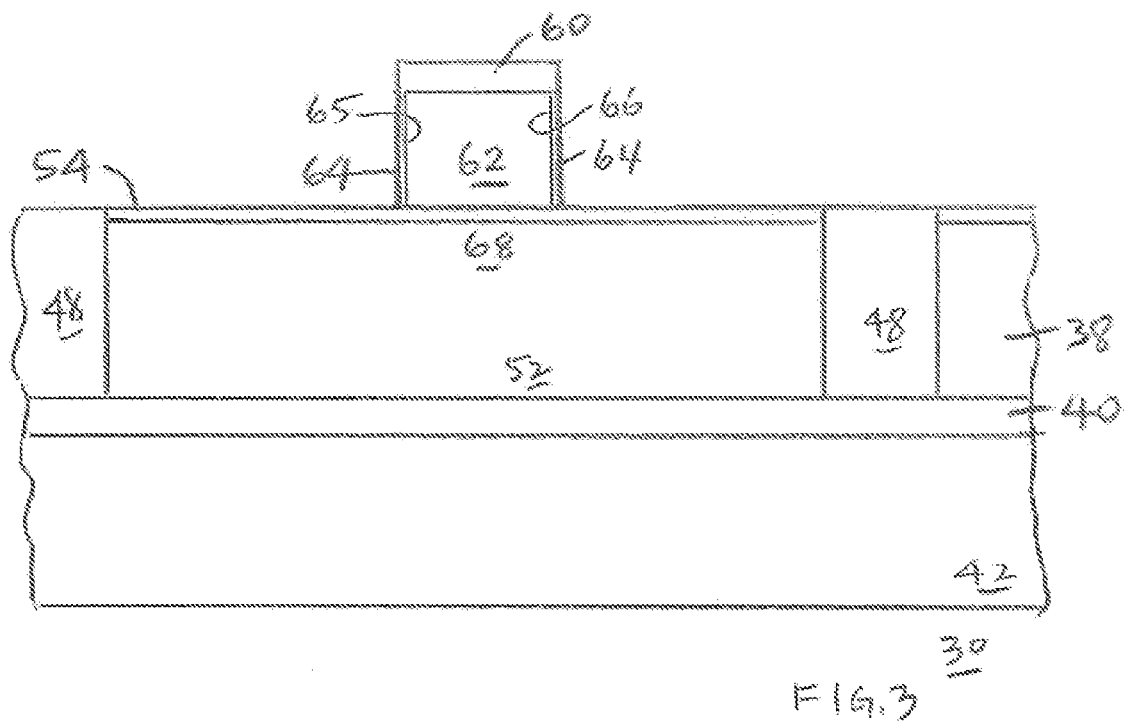

As illustrated in FIG. 3, gate electrode forming material 58 and hard mask material are photolithographically patterned and etched to form a gate electrode 62 overlaid by the hard mask material. The polycrystalline silicon can be etched in the desired pattern by, for example, plasma etching in a Cl or $HBr/O_2$ chemistry and the hard mask can be etched, for example, by plasma etching in a $CHF_3$, $CF_4$, or $SF_6$ chemistry. Following the patterning of the gate electrode, in accordance with one embodiment of the invention, a thin layer 64 of silicon oxide is thermally grown on the opposing sidewalls 65 and 66 of gate electrode 62. The thin oxide can have a thickness, for example, of about 2-3 nm. The formation of gate electrode 62 defines a channel region 68 as that portion at the surface of thin silicon layer 38 underlying the gate electrode. Preferably the channel is oriented along a [110] crystal direction so that current flow in the transistor will be in the [110] crystal direction. Thin oxide layer 64 provides a liner to separate the polycrystalline silicon gate electrode from subsequently deposited spacer forming materials.

Figure 4:
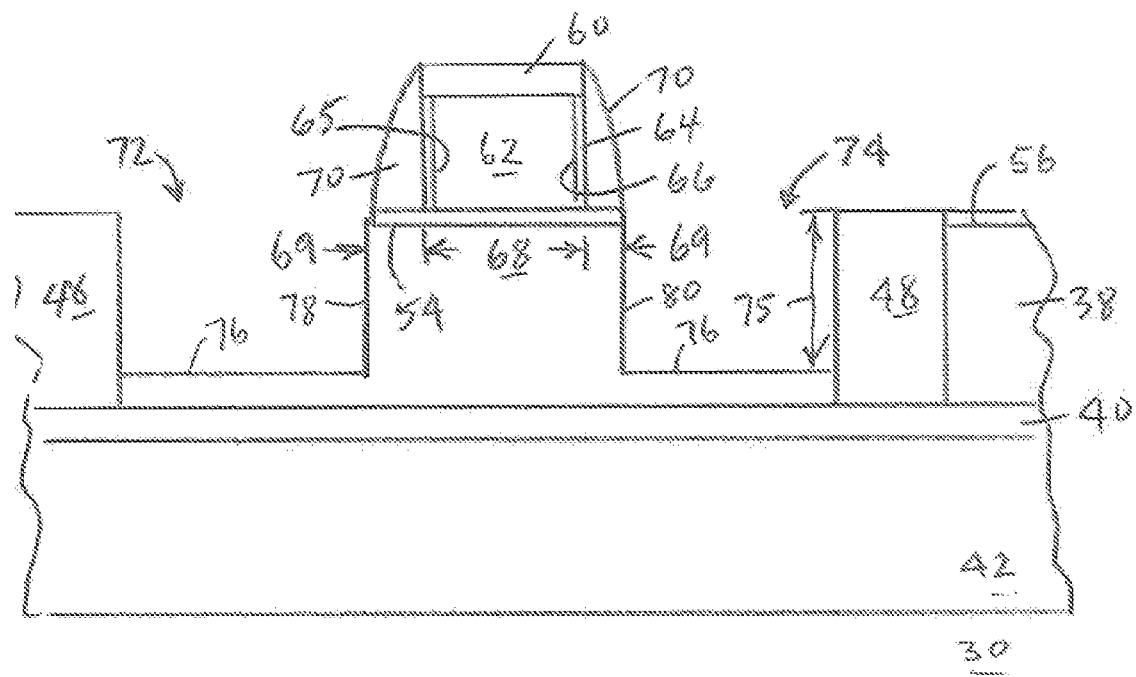

The method in accordance with one embodiment of the invention continues by blanket depositing a layer of silicon nitride or other spacer forming material (not illustrated) and anisotropically etching the layer to form spacers 70 overlying thin layer 64 of silicon oxide on opposing sidewalls 65 and 66 as illustrated in FIG. 4. The silicon nitride layer is deposited to a thickness of about 80-250 nm, preferably by LPCVD using dichlorosilane and ammonia as reactants. The sidewall spacers can be anisotropically etched, for example by reactive ion etching (RIE), using a $CF_4$ or $CHF_3$ chemistry. Recesses 72 and 74 are etched into thin silicon layer 38 using spacers 70, gate electrode 62, and STI 48 as etch masks. Because the sidewall spacers are used as an etch mask, the recesses are self aligned to sidewalls 65 and 66 of gate electrode 62 and to channel 68 and are spaced apart from the gate electrode by a distance substantially equal to the thickness of the sidewall spacers as indicated by arrows 69. Recesses 72 and 74 are anisotropically etched, for example, by reactive ion etching (RIE) using a $HBr/O_2$ chemistry to a depth of about 400-600 nm as indicated by arrows 75. At least a thin portion of silicon layer 38 is left beneath bottom surface 76 of the trenches.

Figure 5:
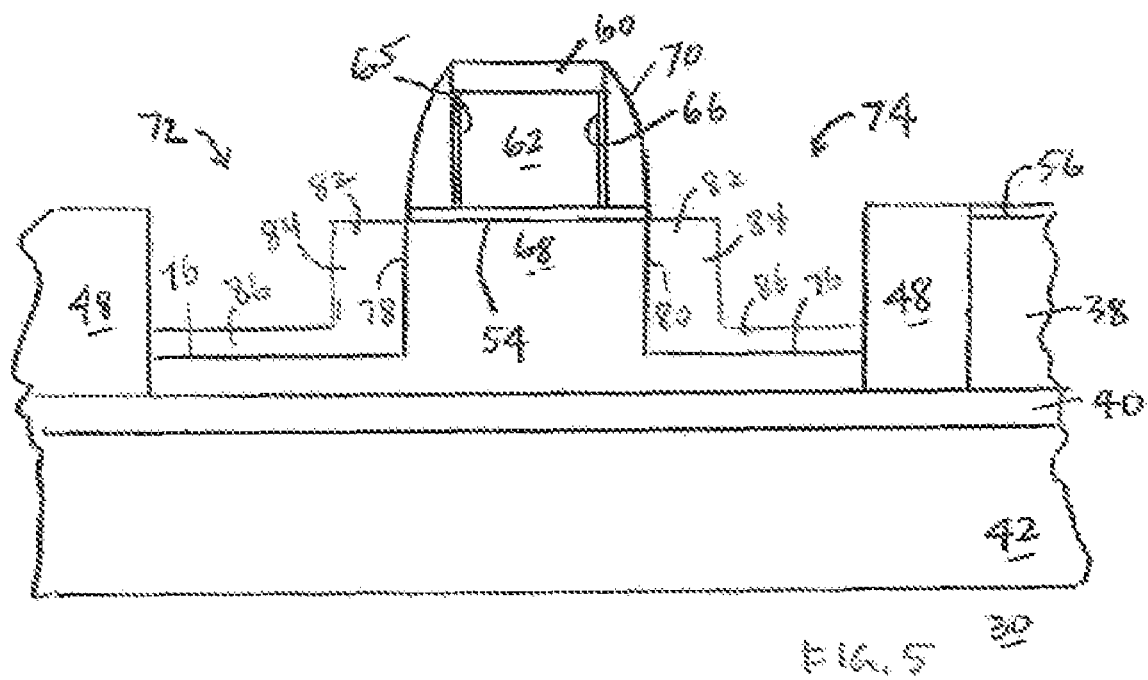

Trenches 72 and 74 have side surfaces 78 and 80, respectively that face channel 68. Bottom surface 76 is substantially parallel to and has the same crystal orientation as surface 56 of thin silicon layer 38. Bottom surface 76 thus lies along a (100) crystal plane. With channel 68 oriented in a [110] crystal direction and side surfaces 78 and 80 substantially perpendicular to surface 56, the side surfaces lie along a (011) crystal plane. In accordance with an embodiment of the invention trenches 72 and 74 are filled with embedded SiGe 82 by a selective epitaxial growth process that provides a higher growth rate on a (011) crystal plane than the growth rate on a (100) crystal plane. The selective epitaxial growth nucleates on the side surfaces as well as on the bottom surface, but a higher growth rate on the (011) plane can be achieved in known manner by adjusting the growth conditions such as reactant flow, growth temperature, growth pressure, and the like during the epitaxial growth as discussed, for example, in "SELECTIVE SILICON EPITAXY AND ORIENTATION DEPENDENCE OF GROWTH" by Rai-Choudhury, P. Schroder, D. K. *Journal of the Electrochemical Society*, v 120, n 5, May, 1973, p 664-668. Epitaxial growth of embedded SiGe 82 is continued to partially fill trenches 72 and 74 as illustrated in FIG. 5. Embedded SiGe 82 is grown with a high concentration of germanium, preferably between about 25-40 atomic percent germanium. Embedded SiGe 82, grown in this manner, grows a thicker layer 84 of the high germanium concentration SiGe on side surfaces 78 and 80 than layer 86 that grows on bottom surface 76. Preferably the high germanium content SiGe on side surfaces 78 and 80 has a thickness of at least 10-30 nm.

Figure 6:
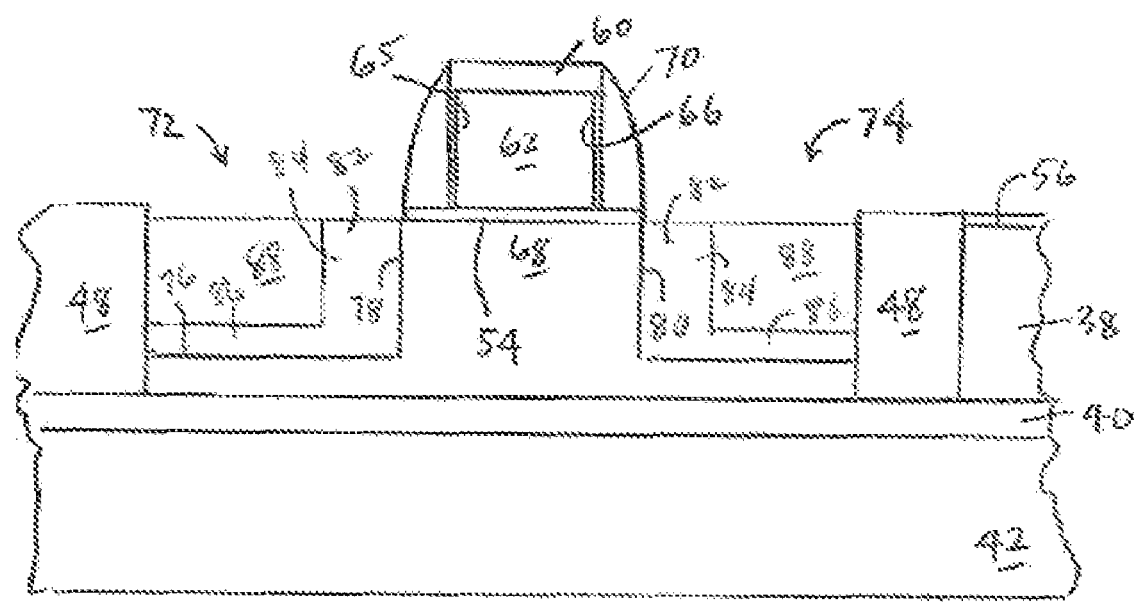

The selective epitaxial growth conditions are changed to reduce the germanium content, and the remaining portion of trenches 72 and 74 are filled with a low concentration embedded SiGe 88 as illustrated in FIG. 6. Preferably embedded SiGe 88 has a germanium concentration of about 0-20 atomic percent germanium. Trenches 72 and 74 are thus filled with embedded SiGe having a thick wall of high germanium concentration along the side surfaces facing channel 68 and a surface of low germanium concentration.

In accordance with a further embodiment of the invention the structures illustrated in FIGS. 5 and 6 are achieved by epitaxially growing high germanium concentration embedded SiGe in a plasma environment with a vertical (i.e., substantially perpendicular to surface 56) potential bias. The epitaxial growth rate in the vertical direction, that is the growth rate on bottom surface 76, will be reduced by the plasma etch component. After a desired thickness of high germanium concentration SiGe is grown on the side surfaces, the epitaxial growth conditions can be altered to reduce the germanium concentration in the low germanium concentration portion of the trench refill. Growth of the low germanium content portion can be accomplished either with or without the plasma environment.

Figure 7:
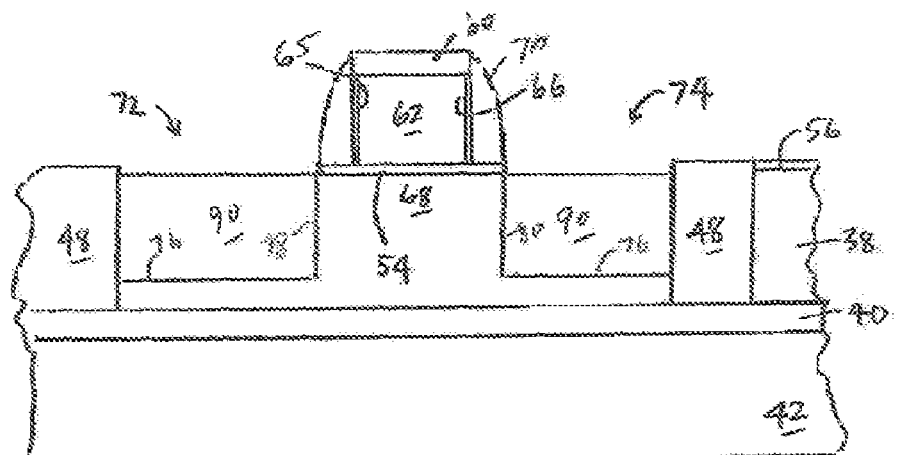
FIGS. 7-9, together with FIGS. 1-4, illustrate, in cross section, a stressed MOS transistor and method steps for its fabrication in accordance with an alternate embodiment of the invention.
Figure 8:
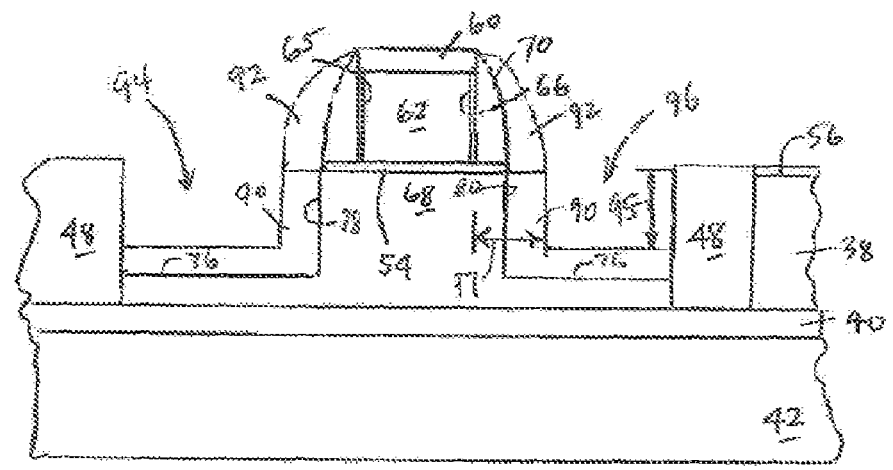
Figure 9:
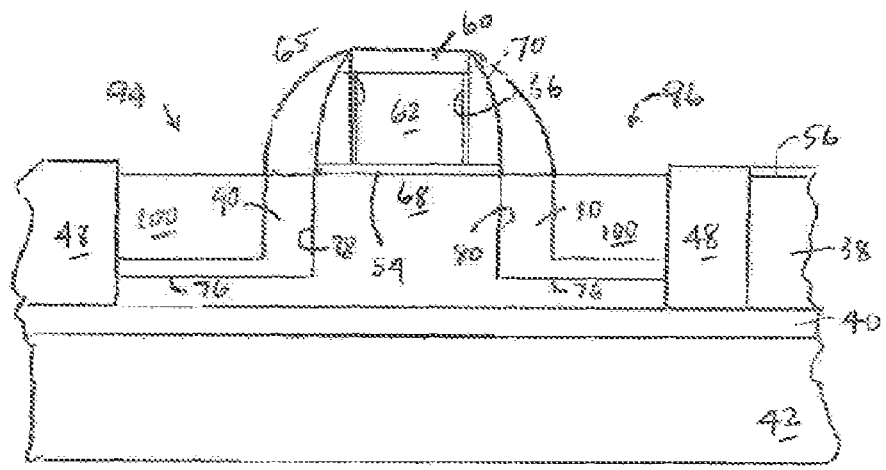

In accordance with a further embodiment of the invention the desired end result of a surface of low concentration germanium SiGe and a sufficiently thick wall of high germanium concentration SiGe along a side surface of a trench facing the transistor channel to exert a greater stress on the channel than would be exerted by the low germanium concentration SiGe alone is achieved as illustrated in FIGS. 7-9 taken together with FIGS. 1-4. The method in accordance with this embodiment of the invention begins with the same steps illustrated in FIGS. 1-4. As illustrated in FIG. 7, trenches 72 and 74 are refilled by selective epitaxial growth by a layer 90 of high germanium concentration SiGe, preferably about 25-40 atomic percent germanium.

The method continues by blanket depositing a layer of silicon nitride or other spacer forming material (not illustrated) overlying the gate electrode 62, sidewall spacers 70, and embedded SiGe 90. The layer of spacer material can be deposited to a thickness of at least 10-30 nm by, for example, LPCVD. The layer of spacer material is anisotropically etched, for example by RIE, to form sidewall spacers 92 overlying sidewall spacers 70. In an alternate embodiment (not illustrated) sidewall spacers 70 can be removed before depositing the layer of spacer material, the spacer material can be deposited to a thickness of about 30-40 nm, and a single sidewall spacer having a thickness of 30-40 nm can be formed. Whether two sidewall spacers or one thicker sidewall spacer are used, the sidewall spacer(s), gate electrode, and STI are used as an etch mask and trenches 94 and 96 are etched into embedded SiGe 90 as illustrated in FIG. 8. Trenches 94 and 96 can be etched by reactive ion etching to a depth of about 15-25 nm as indicated by arrow 95. Trenches 94 and 96 are self aligned to channel 68 and are spaced apart from the channel by the width of the spacer(s) as indicated by arrow 97.

As illustrated in FIG. 9, trenches 94 and 96 are refilled with selectively grown low germanium concentration epitaxial SiGe 100 preferably having a germanium concentration of about 0-20 atomic percent. Similar to the previous embodiment, the transistor has a low germanium concentration SiGe surface 98 and a thick wall of high germanium concentration SiGe facing channel 68. The high germanium concentration SiGe has a sufficient thickness to exert more stress on the channel of the transistor than would be exerted by the low germanium concentration SiGe alone.

Although not illustrated, the structures illustrated in FIGS. 6 and 9 can be completed in conventional manner. Conventional steps include, for example, removing sidewall spacers 70 and 92 and replacing them with a single permanent sidewall spacer. The permanent sidewall spacers are used as an ion implantation mask and conductivity determining ions are implanted into the silicon or SiGe on either side of the gate electrode to form source and drain regions. For a PMOS transistor the conductivity ions can be boron ions. As those of skill in the art will understand, more than one set of sidewall spacers can be used and more than one ion implantation can be carried out to create source and drain extensions, create halo implants, set threshold voltage, and the like. The sidewall spacers can also be used to form self aligned metal silicide contacts to the source and drain regions. A layer of silicide forming metal is deposited and heated to cause the metal to react with exposed silicon or SiGe to form a metal silicide. Metal that is not in contact with exposed silicon such as metal that is deposited on the sidewall spacers or the STI does not react and can be removed by etching in a solution of $H_2O_2/H_2SO_4$ or $HNO_3/HCl$. In forming a stressed MOS transistor a stress liner layer of, for example, stressed silicon nitride may be deposited over the gate electrode and metal silicide contacts. Deposition of the stress liner is followed by deposition of a dielectric layer, planarization of the dielectric layer, and etching of contact openings through the dielectric layer to the metal silicide contacts. Electrical contact to the source and drain regions can then be made by contact plugs formed in the contact openings and by interconnect metal deposition and patterning.

The foregoing embodiments have been of methods for fabricating stress enhanced PMOS transistors. Similar methods can be used to fabricate stress enhanced NMOS transistors, and the fabrication of either structure or both structures can be integrated into methods for fabricating CMOS integrated circuits including both stressed and unstressed PMOS and NMOS transistors. Fabrication of a stress enhanced NMOS transistor is similar to the methods described above except that the thin silicon layer is impurity doped P-type, the source and drain regions are impurity doped with N-type conductivity determining ions, and the embedded material that is epitaxially grown in the source and drain regions should have a substitutional atom such as carbon such that the grown material has a lattice constant that is smaller than the lattice constant of the host material to create a longitudinal tensional stress on the transistor channel.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method for fabricating a stress enhanced MOS device having a channel region at a surface of a semiconductor substrate, the method comprising the steps of:
    etching trenches into the semiconductor substrate adjacent the channel region, each of the trenches having a side surface facing the channel region and a bottom surface;
    epitaxially growing a first layer of SiGe having a first concentration of germanium in the trenches to partially fill the trenches, the first layer of SiGe having a first growth rate on the side surface and a second growth rate less than the first growth rate on the bottom surface; and
    epitaxially growing a second layer of SiGe having a second concentration of germanium less than the first concentration to fill the trenches.

2. The method of claim 1 wherein the semiconductor substrate is a substrate comprising silicon having a (100) crystal surface orientation, the channel region is oriented along a [110] crystal direction, the side surface has a (011) crystal surface orientation, and wherein the step of epitaxially growing a first layer comprises the step of adjusting epitaxial growth conditions to enhance epitaxial growth rate on a (011) crystal surface compared to epitaxial growth rate on a (100) crystal surface.

3. The method of claim 1 wherein the step of epitaxially growing a first layer comprises the step of epitaxially growing a first layer in a plasma environment having a potential bias substantially perpendicular to the semiconductor substrate.

4. The method of claim 1 wherein the step of epitaxially growing a first layer comprises the step of epitaxially growing a layer of SiGe comprising 25-40 atomic percent germanium.

5. The method of claim 4 wherein the step of epitaxially growing a second layer comprises the step of epitaxially growing a layer of SiGe comprising 0-20 atomic percent germanium.

6. The method of claim 1 farther comprising the steps of:
    forming a gate insulator overlying the channel region;
    forming a gate electrode overlying the gate insulator;
    forming sidewall spacers on the gate electrode; and
    wherein the step of etching trenches comprises the step of etching trenches in alignment with the sidewall spacers.

7. A method for fabricating a stress enhanced MOS transistor comprising the steps of:
    forming a gate insulator overlying a semiconductor substrate;
    forming a gate electrode overlying the gate insulator, the gate electrode having a first edge and a second edge;
    etching a first trench and a second trench into the semiconductor substrate, the first trench aligned with and spaced apart from the first edge by a first distance and the second trench aligned with and spaced apart from the second edge by the first distance;

epitaxially growing a first layer of SiGe having a first concentration of germanium in the first trench and in the second trench; the first layer having a thickness sufficient to fill the first trench and the second trench;

etching a third trench and a fourth trench into the first layer, the third trench aligned with and spaced apart from the first side by a second distance greater than the first distance and the fourth trench aligned with and spaced apart from the second side by the second distance; and epitaxially growing a second layer of SiGe having a second concentration of germanium less than the first concentration in the third trench and in the fourth trench and having a second thickness sufficient to fill the third trench and the fourth trench.

8. The method of claim 7 further comprising the step of:

forming first sidewall spacers on the first edge and on the second edge, the first sidewall spacers having a first thickness; and wherein the step of etching a first trench and a second trench comprises the step of etching a first trench and a second trench using the first sidewall spacers as an etch mask.

9. The method of claim 8 further comprising the step of:

forming second sidewall spacers overlying the first sidewall spacers; and wherein the step of etching a third trench and a fourth trench comprises the step of etching the third trench and the fourth trench using the second sidewall spacers as an etch mask.

10. The method of claim 8 further comprising the steps of:

removing the first sidewall spacers after the step of etching the first trench and the second trench;

forming second sidewall spacers on the first edge and on the second edge, the second sidewall spacers having a second thickness greater than the first thickness; and wherein the step of etching a third trench and a fourth trench comprises the step of etching the third trench and the fourth trench using the second sidewall spacers as an etch mask.

11. The method of claim 7 wherein the step of epitaxially growing a first layer comprises the step of epitaxially growing a layer of SiGe comprising 25-40 atomic percent germanium and wherein the step of epitaxially growing a second layer comprises the step of epitaxially growing a second layer of SiGe comprising less than 20 atomic percent germanium.

12. A method for fabricating a stress enhanced MOS transistor in and on a monocrystalline semiconductor substrate having a first lattice constant, the method comprising the steps of:

forming a gate electrode overlying and defining a channel region in the monocrystalline semiconductor substrate;

etching a trench into the monocrystalline semiconductor substrate adjacent the channel region and having a side surface facing the channel region and a bottom surface;

filling the trench with a second monocrystalline semiconductor material having a first concentration of a substitutional atom and a third monocrystalline semiconductor material having a second concentration of the substitutional atom, the second monocrystalline semiconductor material having a wall thickness along the side surface sufficient to exert a greater stress on the channel region than a stress exerted by a monocrystalline semiconductor material having the second concentration.

13. The method of claim 12 wherein the step of filling the trench comprises the step of filling the trench with a monocrystalline material having a second lattice constant different than the first lattice constant.

14. The method of claim 12 wherein the monocrystalline semiconductor substrate comprises a monocrystalline silicon substrate and wherein the step of filling the trench comprises the step of filling the trench with monocrystalline SiGe having a first concentration of germanium followed by SiGe having a second concentration of germanium less than the first concentration.

15. The method of claim 12 wherein the step of filling the trench comprises the steps of filling the trench with a second monocrystalline semiconductor material comprising SiGe having a germanium content of 25-40 atomic percent and with a third monocrystalline semiconductor material comprising SiGe having a germanium content of less than 20 atomic percent.

16. The method of claim 12 wherein the step of filling the trench comprises filling the trench with a second monocrystalline semiconductor material comprising SiGe having a wall thickness along the side surface of at least 10 nm.

17. The method of claim 12 wherein the step of filling the trench comprises the steps of:

epitaxially growing first SiGe having a first concentration of germanium to fill the trench;

etching a second trench into the first SiGe, the second trench spaced apart from the channel region by the wall thickness; and epitaxially growing second SiGe having a second concentration of germanium less than the first concentration to fill the second trench.

18. The method of claim 17 wherein the step of filling the trench comprises the step of epitaxially growing SiGe having a germanium concentration of 25-40 atomic percent and the step of filling the second trench comprises the step of epitaxially growing SiGe having a germanium concentration of less than 20 atomic percent.

19. The method of claim 12 wherein the step of filling the trench comprises the steps of:

initiating growth of the second monocrystalline semiconductor material with an epitaxial growth process having an accelerated growth rate along the side surface in comparison to the bottom surface;

reducing concentration of the substitutional atom; and epitaxially growing the third monocrystalline semiconductor material to complete filling of the trench.

20. A stress enhanced MOS transistor comprising:

a semiconductor substrate having a surface;

a channel region at the surface of the semiconductor substrate;

a first region of SiGe having a first germanium concentration embedded in the semiconductor substrate and having a bottom portion and a side portion adjacent the channel region wherein the side portion has a greater thickness than the bottom portion; and a second region of SiGe having a second germanium concentration less than the first germanium concentration embedded in the first region.

* * * * *